United States Patent [19]

Henne et al.

[11] Patent Number: 4,734,444
[45] Date of Patent: Mar. 29, 1988

[54] CURABLE MIXTURES CONTAINING N-SULFONYLAMINOSULFONIUM SALTS AS CATIONICALLY ACTIVE CATALYSTS

[75] Inventors: Andreas Henne, Neustadt; Wolfram Ochs, Wachenheim; Helmut Tesch, Birkenheide; Gunnar Schornick, Neuleiningen; Reinhold J. Leyrer, Ludwigshafen, all of Fed. Rep. of Germany

[73] Assignee: BASF Aktiengesellschaft, Ludwigshafen, Fed. Rep. of Germany

[21] Appl. No.: 13,965

[22] Filed: Feb. 12, 1987

[30] Foreign Application Priority Data

Feb. 14, 1986 [DE] Fed. Rep. of Germany ....... 3604580

[51] Int. Cl.$^4$ ...................... C08G 59/72; C08G 59/68
[52] U.S. Cl. .......................... 522/24; 522/25; 522/31; 522/170; 522/122; 522/14; 522/15; 430/280; 430/914; 556/69; 564/85; 564/89; 564/91; 564/98; 564/99; 564/80; 560/12; 526/192; 526/193; 526/195; 526/220; 528/89; 528/90; 528/408; 562/430; 260/501.21; 260/513 F
[58] Field of Search .................... 522/24, 25, 31; 526/192, 193, 195, 200; 564/91; 528/89, 90, 408

[56] References Cited

U.S. PATENT DOCUMENTS

| | | |
|---|---|---|
| 3,205,157 | 9/1965 | Licari et al. . |
| 3,708,296 | 1/1973 | Schlesinger . |
| 4,035,189 | 7/1977 | Hayashi .................. 522/65 |
| 4,173,476 | 11/1979 | Smith .................. 522/31 |
| 4,231,951 | 11/1980 | Smith .................. 522/31 |
| 4,299,938 | 11/1981 | Green .................. 526/192 |
| 4,339,567 | 7/1982 | Green .................. 528/102 |
| 4,383,025 | 5/1983 | Green .................. 430/280 |
| 4,398,014 | 8/1983 | Green .................. 522/31 |
| 4,405,765 | 9/1983 | Demmler .................. 525/506 |
| 4,431,774 | 2/1984 | Felder .................. 522/31 |
| 4,456,679 | 6/1984 | Leyrer .................. 430/326 |
| 4,465,760 | 8/1984 | Leyrer .................. 430/325 |
| 4,500,629 | 2/1985 | Irving .................. 522/24 |
| 4,533,446 | 8/1985 | Conway .................. 522/24 |
| 4,565,771 | 1/1986 | Lynch .................. 430/307 |

FOREIGN PATENT DOCUMENTS

| | | |
|---|---|---|
| 1512981 | 6/1978 | United Kingdom . |
| 1516511 | 7/1978 | United Kingdom . |
| 1516512 | 7/1978 | United Kingdom . |
| 1516351 | 7/1978 | United Kingdom . |
| 1516352 | 7/1978 | United Kingdom . |
| 2013208 | 8/1979 | United Kingdom . |

OTHER PUBLICATIONS

P. Manya, A. Sekera and P. Rumpf: Bulletin Soc. Chim., France, vol. 1, pp. 286–294 (1971).
O. Bohman and S. Allenmark: Chem. Scripta 4, 202–206 (1973).
D. Darwish and S. K. Datta: Tetrahedron 30, 1155–1160 (1974).
Vilsmaier, Huber & Schuetz: Liebigs Annalen der Chemie, 1055–1063 (1980).

Primary Examiner—John C. Bleutge
Assistant Examiner—A. H. Koeckert
Attorney, Agent, or Firm—Keil & Weinkauf

[57] ABSTRACT

Mixtures which are curable by heating or irradiation with actinic light contain one or more cationically curable compounds, such as an epoxy, an olefinically unsaturated monomer, amino resin or phenolic resin, and as a cationically active curing catalyst one or more N-sulfonylamino-sulfonium salts of the formula

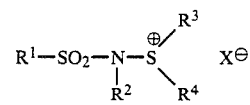

such as N-p-toluenesulfonyl-N-methylaminodiphenylsulfonium hexafluorophosphate with or without quinones or peroxides are suitable, inter alia, for producing moldings, coatings, relief images and resist patterns.

10 Claims, No Drawings

CURABLE MIXTURES CONTAINING N-SULFONYLAMINOSULFONIUM SALTS AS CATIONICALLY ACTIVE CATALYSTS

The present invention relates to cationically curable mixtures which contain as catalyst an N-sulfonylaminosulfonium salt, are curable by heating or irradiation with actinic light and are suitable for producing shaped articles, coatings, relief images and resist patterns.

Cationically curable mixtures such as epoxy resins are customarily cured with carboxylic acids or anhydrides thereof or by adding other Lewis acids. Owing to the high reactivity, the two components must be handled separately and be rapidly processed after mixing. There has been no shortage of attempts to develop one-component systems which have a long shelf life and are curable either by heating or by irradiation with light of a suitable wavelength. A large number of photoinitiators have been described for use as catalysts for the light-induced curing, of which in particular the diazonium salts of U.S Pat. Nos. 3,205,157 and 3,708,296, the onium salts of elements of main groups V (see No. DE-A-2,518,656), VI (see Nos. DE-A-2,518,652 and -2,904,626) and VII (see No. DE-A-2,518,639) of the periodic table of the elements and the sulfoxonium salts mentioned in No. EP-A-22,081, -35,969 and -44,274 may be singled out. However, these compounds do not have satisfactory properties. Diazonium salts evolve nitrogen on irradiation, which can lead to blistering in coatings and shaped articles produced with diazonium salts. The iodonium salts of No. DE-A-2,518,639 are toxic, and, in addition, like the onium salts of No. DE-A-2,518,652 and -2,904,626 their absorption in the wavelength region 300–400 nm is only weak, so that a sensitizer must usually be added to the photocurable mixtures. Furthermore, some of the onium salts of Nos. DE-A-2,518,652 and -2,904,626 evolve foul-smelling low molecular weight sulfur compounds on irradiation with actinic light. The sulfoxonium salts of Nos. EP-A-22,081, -35,969 and -44,274 are difficult to obtain, requiring the use of costly organometallic reagents, which is an obstacle to production on an industrial scale.

A catalyst for thermocurable systems which is described in No. DE-A-2,853,886 comprises a combination of iodonium salt and $Cu^I$ salt, which, however, can only be used with considerable safety precautions, owing to the high toxicity of the iodonium salt. A further catalyst combination is the mixture of pyrylium salts and metal chelates described in DE-A-3,135,636; however, the shelf life of mixtures prepared by means of this initiator combination leaves something to be desired.

It is an object of the present invention to provide cationically curable mixtures which contain a cationically active curing catalyst, which have a long shelf life, are easy to handle and process and are nontoxic, and which, after curing, produce shaped articles of high surface quality and solvent resistance.

We have found that this object is achieved with a curable mixture which contains (a) a compound or a mixture of compounds which, under the influence of a cationic catalyst, are convertible into a higher molecular weight compound or a resin and (b) an active amount as a curing catalyst, of an N-sulfonylamino-sulfonium salt of the formula (I)

where $R^1$ is branched or straight-chain $C_1$–$C_{18}$-alkyl, 5- or 6-ring-cycloalkyl, ie. cycloalkyl of 5 or 6 carbon atoms as ring members, or phenyl which may be substituted by chlorine or bromine atoms, $C_1$–$C_6$-alkyl, $C_1$–$C_6$-alkoxy or $C_1$–$C_6$-alkylthio groups or carboxyl or alkoxycarbonyl groups, $R^2$ is $C_1$–$C_6$-alkyl, 5- or 6-ring-cycloalkyl (see above), aliphatic $C_1$–$C_6$-acyl or substituted or unsubstituted benzoyl, $R^3$ and $R^4$ each have the same meanings as $R^1$ and can be identical to or different from $R^1$ and each other, and $X^\ominus$ is a nonnucleophilic anion.

The present invention further provides processes for producing a shaped article or a surface coating from the curable mixture mentioned by heating or by irradiating with light of wavelength 200–600 nm and a light-sensitive recording material containing an N-sulfonylaminosulfonium salt for producing a relief image or resist pattern.

Very suitable N-sulfonylaminosulfonium salts of the formula (I) contain as $R^1$, $R^3$ and $R^4$ methyl, ethyl, n-propyl, i-propyl, t-butyl, cyclohexyl, cyclopentyl, stearyl, lauryl, methylphenyl, dimethylphenyl, trimethylphenyl, ethylphenyl, isopropylphenyl, chlorophenyl, bromophenyl, dichlorophenyl, dibromophenyl, methoxyphenyl, ethylthiophenyl, carboxyphenyl or carbomethoxyphenyl and as $R^2$ methyl, ethyl, propyl, cyclohexyl, cyclopentyl, acetyl, propionyl, pivaloyl, benzoyl, methylbenzoyl, ethylbenzoyl or chlorobenzoyl.

Suitable nonnucleophilic anions $X^\ominus$ are perchlorate, trifluoromethanesulfonate and in particular anions of the formula (II)

$$[MY_nZ_m]^\ominus \qquad (II),$$

where M is boron, bismuth, antimony, arsenic or phosphorus, Y is fluorine and/or chlorine, Z is hydroxyl, m is 0 or 1 and n is 4–6 with the proviso that the total of m and n is in each case greater by one unit than the valence of M. $[MY_nZ_m]$ can be in particular a tetrafluoroborate, hexafluorophosphate, hexafluoroarsenate, hexachloroantimonate or hexafluoroantimonate anion.

Very suitable curing catalysts of the formula (I) are those in which $R^1$ is phenyl or $C_1$–$C_4$-alkylphenyl, $R^2$ is $C_1$–$C_4$-alkyl, $R^3$ and $R^4$, identical or different, are each $C_1$–$C_4$-alkyl, phenyl or $C_1$–$C_4$-alkylphenyl and $X^\ominus$ is one of the anions $BF_4^\ominus$, $PF_6^\ominus$, $AsF_6^\ominus$ or $CF_3SO_3^\ominus$, in particular one of the first three. Preferably $R^1$ is phenyl or p-methylphenyl, $R^2$ is methyl or ethyl, $R^3$ and/or $R^4$ are each methyl, ethyl, phenyl or p-methylphenyl. Examples of very active N-sulfonylamino compounds are the salts of the N-p-toluenesulfonyl-N-methylaminodiphenylsulfonium, of the N-p-toluenesulfonyl-N-ethylaminodiphenylsulfonium, N-phenylsulfonyl-N-methylaminodiphenylsulfonium, of the N-p-toluenesulfonyl-N-methylaminodimethylsulfonium, of the N-p-toluenesulfonyl-N-methylaminodiethylsulfonium and of the N-p-toluenesulfonyl-N-methylaminoditolylsulfonium cation with the hexafluorophosphate, hexafluoroarsenate, hexafluoroantimonate, hexachloroantimonate, pentafluorohydroxyantimonate or pentachlorohydroxyantimonate anion.

Suitable preparative processes for N-sulfonylaminosulfonium salts are described for example by P. Manya, A. Sekera and P. Rumpf in Bull. Soc. Chim. Fr. 1971, 286, by O. Bohman and S. Allenmark in Chem. Scripta 4 (1973), 202, by D. Darwish and S. K. Datta in Tetrahedron 30 (1974), 1155, and by E. Vilsmaier, M. Huber and J. Schuetz in Ann. Chem. 1980, 1055.

The curable resin compositions according to the invention contain
(a) a compound or a mixture of compounds which, under the influence of a cationic catalyst, are convertible into a higher molecular weight material and
(b) preferably 0.1-15 percent by weight of the above-described N-sulfonylaminosulfonium salts, based on the amount of compounds (a).

Compounds (a) can be for example oxetanes, thiiranes or tetrahydrofuran. Preferably compound (a) is a 1,2-epoxide, an olefinically unsaturated compound, an amino resin or a phenolic resin, insofar as these are cationically curable or polymerizable.

Examples of suitable 1,2-epoxides are epichlorohydrin, propylene oxide and glycidyl ethers of any monohydric alcohol or phenol, such as n-butyl glycidyl ether or phenyl glycidyl ether, glycidyl esters such as glycidyl acrylate or glycidyl methacrylate. Preferably component (a) is an epoxy resin and in particular an epoxy resin which contains one or more groups which are directly linked to oxygen and have the formula

(III)

where either $R^5$ and $R^7$ are each hydrogen, in which case $R^6$ is hydrogen or methyl, or $R^5$ and $R^7$ are together $-CH_2CH_2-$, in which case $R^6$ is hydrogen. Examples of such resins are polyglycidyl and poly($\beta$-methylglycidyl) esters which can be obtained by reacting a compound which contains two or more carboxylic acid groups with epichlorohydrin, glyceroldichlorohydrin or $\beta$-methylepichlorohydrin in the presence of alkali. These polyglycidyl esters can be derived from aliphatic polycarboxylic acids, such as succinic acid, glutaric acid, adipic acid, pimelic acid, suberic acid, azelaic acid, sebacic acid or dimerized or trimerized linoleic acid, cycloaliphatic polycarboxylic acids such as tetrahydrophthalic acid, 4-methyltetrahydrophthalic acid, hexahydrophthalic acid or 4-methylhexahydrophthalic acid and from aromatic polycarboxylic acids such as phthalic acid, isophthalic acid or terephthalic acid. Further suitable polyglycidyl esters are obtainable by polymerization of glycidyl esters of olefinically unsaturated acids, in particular glycidyl acrylate and glycidyl methacrylate.

Also suitable are polyglycidyl and poly($\beta$-methylglycidyl) ethers of the type obtainable by reacting a compound which contains two or more free alcoholic and/or phenolic hydroxyl groups per molecule with the corresponding epichlorohydrin under alkaline conditions or even in the presence of an acid catalyst with subsequent alkali treatment. Examples of alcohols and phenols for such a reaction are ethylene glycol, propanediol, diethylene glycol, poly(oxyethylene) glycols, poly(oxypropylene) glycols, poly(oxytetramethylene) glycols, glycerol, 1,1,1-trimethylolpropane, pentaerythritol, sorbitol, bis(4-hydroxycyclohexyl)methane, 2,2-bis(4-hydroxycyclohexyl)propane, N,N-bis(2-hydroxyethyl)aniline, p,p'-bis(2-hydroxyethylamino)diphenylmethane, bis(4-hydroxyphenyl)methane, bis(4-hydroxyphenyl) sulfone, 2,2-bis(4-hydroxyphenyl)propane and novolaks as can be prepared by reacting aldehydes such as formaldehyde or acetaldehyde with phenols.

Examples of epoxy resins having groups of the formula III where $R^5$ and $R^7$ are together a $-CH_2CH_2-$ group are bis(2,3-epoxycyclopentyl) ether and 2,3-epoxycyclopentyl glycidyl ether.

It is also possible to use epoxy resins in which some or all epoxy groups are medial, such as vinylcyclohexene dioxide or dicyclopentadiene dioxide, as well as epoxidized polybutadienes or epoxidized copolymers of butadiene with vinyl monomers. It is of course also possible to use epoxy resin mixtures.

Particularly preferred epoxy resins are the diglycidyl ethers of dihydric phenols and of dihydric aliphatic alcohols.

If desired, the epoxy resin can also be subjected in a conventional manner to cocuring with a polyhydric alcohol, in particular with a polyhydric alcohol having a molecular weight of over 1,000. Suitable alcohols for this purpose are for example poly(oxyethylene) glycols, polyvinyl alcohols, hydroxypropylcellulose and partial esters of cellulose.

Olefinically unsaturated monomers a) which can be cationically polymerized with the N-sulfonylaminosulfonium salts are, for example, styrene, $\alpha$-methylstyrene, divinylbenzene, vinylcyclohexane, 4-vinylcyclohex-1-ene, N-vinylcarbazole, isoprene, butadiene and preferably vinyl ethers such as methyl vinyl ether, isobutyl vinyl ether, 1,1,1-trimethylolpropane trivinyl ether, glycerol trivinyl ether, the vinyl ethers of ethylene glycol and polyethylene glycols, and cyclic vinyl ethers.

The amino resins preferred for use as component (a) contain per molecule two or more methylol groups which are bonded to an amide or thioamide nitrogen atom or atoms and which may also be etherified or esterified. Examples of such amino resins are the N-hydroxymethyl, N-methoxymethyl, N-butoxymethyl and N-acetoxymethyl derivatives of urea, thiourea or cyclic ureas, of carbamates and dicarbamates of aliphatic monohydric and dihydric alcohols, and of melamine, such as partially etherified hexamethylolmelamine, or of further polyamino-1,3-triazines. Preferred amino resins are the condensation products of urea, hydantoin or melamine with formaldehyde, for example a condensation product of urea with 1.8 moles of formaldehyde, as well as partially or completely etherified products of such condensation products with an aliphatic monohydric alcohol of 1 to 4 carbon atoms, such as hexamethoxymethylmelamine.

Preferred phenolic resins are known resols prepared from a monohydric or polyhydric phenol and an aldehyde such as formaldehyde. The curable mixtures according to the invention may contain suitable additives such as diluents, reinforcing agents, fillers, dyes, pigments, processing aids or other customary additives whose nature and amount are known to those skilled in the art.

The curable resin compositions prepared by means of the N-sulfonylaminosulfonium salts described may further contain, as an additional component, an oxidizing agent from the class of the quinones and the organic peroxides to accelerate the rate of curing. Suitable compounds are for example ketone peroxides, peroxy acids, aldehyde peroxides, hydroperoxides, but in particular alkyl peroxides, diacyl peroxides and alkyl esters of peracids, for example butyl peroxypivalate, benzoyl peroxide, di-tert.-butyl peroxide, tert.-butyl hydroperoxide, methyl ethyl ketone peroxide or m-chloroperbenzoic acid. Examples of suitable quinones are the partially or completely chlorine- or cyano-substituted benzoquinones such as chloranil or 2,3-dichloro-5,6-dicyanobenzoquinone.

The curable mixtures according to the invention contain in general from 0.1 to 15, preferably from 0.5 to 10, percent by weight of the N-sulfonylaminosulfonium salts with or without from 0.01 to 10, preferably from 0.05 to 2, percent by weight of the aforementioned oxidizing agents, based on the total amount of curable compounds (a).

The mixtures according to the invention can be cured by heating or by irradiation with actinic light of wavelength 200–600 nm the best method of curing depending on the components used in the mixtures and on the intended use thereof.

Preferably the compositions according to the invention also contain a sensitizer. We have found that the incorporation of suitable sensitizers increases the rate of curing even further, making possible even shorter exposure times and/or less powerful sources of irradiation. In addition, the sensitivity for visible light is increased. Suitable sensitizers are acetophenone derivatives such as benzil dimethyl ketal, benzoin ethers, benzophenone or derivatives thereof and thioxanthone derivatives such as 2-methylthioxanthone or 2-isopropylthioxanthone. Further suitable sensitizers are polycyclic aromatics, such as anthracene, phenanthrene, rubrene, perylene and pyrene. Preferably from 0.1 to 2% by weight of sensitizer is used, based on the total amount of components (a).

Suitable sources of actinic radiation for photocuring at 200–600 nm wavelength are the known sources such as carbon arc lights, mercury vapor lights, fluorescent tubes emitting ultraviolet light, argon and xenon glow lamps and photographic floodlights. The time required for exposure depends inter alia on the polymerizable material used, the nature of the light source and on the distance thereof from the irradiated material and is easily determined by the skilled worker in a preliminary test.

If the curable composition is to be thermocured, it is brought into a suitable form, for example cast as a thin film. To effect curing, the resin is heated to 80°–160° C., preferably 100°–150° C.

The compositions according to the invention are usable for example as surface coatings and, after application to a substrate such as steel, aluminum, copper, cadmium, zinc, paper or wood, are fully curable by irradiation or heating. On irradiation through a mask the unexposed areas can subsequently be removed by washing out. The mixtures according to the invention are usable in particular for manufacturing printing plates and printed circuits, for which the known methods for manufacturing printing plates and printed circuits from photopolymerizable compositions can be used.

The mixtures according to the invention are also usable as adhesives, in the manufacture of fiber-reinforced composites, including platen press materials, for producing bonding cements and mortars or for dip coatings.

A mixture according to the invention which contains for example an epoxy resin or phenolic resin and an active amount of an N-sulfonylaminosulfonium salt for polymerizing the epoxy or phenolic resin on exposure of the composition to actinic radiation can also contain a curing amount of latent hot curing agent for the epoxy resin or phenolic resin, such as polycarboxylic anhydrides, complexes of amines, in particular primary or tertiary aliphatic amines with boron trifluoride or boron trichloride and latent boron trifluoride chelates. Suitable heat-activatable crosslinking agents for resols are inter alia hexamethylenetetramine and paraformaldehyde. The temperature and heating time required for hot curing and the proportions of heat-activatable curing agent can be easily determined in a conventional manner by means of preliminary experiments.

A particular embodiment of the novel mixtures with the N-sulfonylaminosulfonium salts is usable as a light-sensitive recording material for the manufacture of relief images or resist patterns in the form of a light-sensitive curable layer applied to a dimensionally stable base material. No. DE-A-3,326,036 describes a photosensitive recording material comprising a dimensionally stable base material and, applied thereto, a solid, light-sensitive, curable layer (L) which contains (i) one or more compounds having two aromatic and/or hetaromatic o-nitrocarbinol ester groups of the general formula (VI)

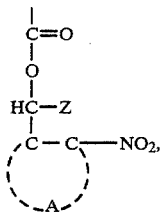

(VI)

where A is the radical of an aromatic or hetaromatic, substituted or unsubstituted ring system of a total of 5 to 14 ring members and Z is hydrogen, alkyl of 1 to 8 carbon atoms or substituted or unsubstituted aryl or aralkyl, (ii) one or more crosslinking compounds which have two or more reactive groups capable of reaction, by the action of heat, with —COOH groups to form a covalent chemical bond and which can also be present as groups, for example amine, imine, amide, epoxy or hydroxyl groups, in compounds (i), and (iii) one or more catalysts for the reaction of crosslinking compound (ii) with —COOH-containing compounds, this catalyst or catalysts being present in blocked, nonactive form, but being photochemically or thermally activatable.

It has been found that the N-sulfonylaminosulfonium salts used in the mixtures according to the invention are highly suitable for use as thermally activatable catalysts for the reaction of crosslinking compounds (ii) with COOH groups. For further details concerning this use of the mixtures according to the invention for such recording materials see Nos. DE-A-3,326,036, -3,231,147 and -3,231,145. The use of N-sulfonylaminosulfonium salts of the formula (I) confers on such recording materials a long shelf life coupled with a short postcuring time. For instance, they can be stored at 50° C. or several weeks without impairment of the very good properties of the recording materials or of the high quality of the relief images or resist patterns prepared therefrom.

Light-sensitive recording materials according to the invention are suitable for preparing letterpress, gravure, offset or screen printing forms, photoresists and soldering masks. They are also suitable for lamination materials in the manufacture of circuit boards, printed circuits, integrated circuits etc. The preparation of the relief images or resist patterns by means of the recording materials according to the invention which contain N-sulfonylaminosulfonium salts can be effected in a conventional manner using as desired a negative-working or positive-working process as described for example in Nos. DE-A-2,309,062, -3,231,144, -3,231,145 and -3,231,147.

To this end, the light-sensitive curable layer (L) of the recording materials according to the invention is first subjected to imagewise exposure with actinic light within the wavelength range of from 200 to 600 nm, preferably from 300 to 420 nm, for example with light from carbon arc lights or mercury low pressure fluorescent lights. Imagewise exposure is effected, depending on the process, either through an image positive or image negative or, in the production of gravure printing forms, through a half-tone screen or half-tone positive or a half-tone screen or half-tone negative (which may also be used together with a continuous tone negative). Imagewise exposure of the light-sensitive curable layer (L) can also be effected with an imagewise modulated actinic laser beam, for example a UV laser. The exposure times for imagewise exposure are in general within the range from 0.05 to 50 minutes.

In the positive-working processes for preparing the relief images or resist patterns, the imagewise exposure of the light-sensitive curable layer (L) is followed by the removal of the exposed areas of the layer, in which the photosensitive substances, such as the o-nitrocarbinol ester groups, have been cleaved to form free carboxyl groups, with an aqueous developer in a conventional manner, for example by spraying, rubbing out or brushing out. The process of imagewise exposure and washing out of the light-sensitive layer (L) can also be repeated several times in the positive-working processes. After the last exposure and the removal of the exposed areas of the layer, the part of the light-sensitive layer (L) which remains on the substrate and which is now a positive image of the imagewise original is uniformly postexposed to actinic light. This uniform postexposure can be effected with the same light sources as used for the abovementioned imagewise exposure, the duration for uniform postexposure being in general within the range from 0.05 to 50 minutes. After uniform postexposure, the layer (L) is thermally crosslinked and cured.

In negative-working processes, after the imagewise exposure of the layer (L) the exposed areas are first selectively thermally cured and crosslinked. The non-crosslinked areas of the layer (L) can thereafter be directly washed out with a suitable developer solution. Advantageously, however, the layer (L) is first uniformly postexposed once more to actinic light and then washed out with an aqueous developer solution. After the layer (L) has been washed out, it can be thermally postcured and post-crosslinked once more. If the layer (L) is washed out immediately after imagewise exposure, it is necessary for such a thermal post-crosslinking and postcuring for the layer (L) to be uniformly exposed once more to actinic light after the washout.

The developer can be any suitable solvent; preference is given both in the positive-working and in the negative-working processes to using aqueous developers. These include water or mixtures of water with water-soluble organic solvents with or without small amounts of alkali or organic base to set an optimal pH.

The conditions for the thermal curing and crosslinking of the layer (L) depend on the N-sulfonylaminosulfonium compound used as catalyst. Advantageously the curing and crosslinking is carried out at elevated temperatures. In general, it is possible with the recording materials according to the invention to keep temperatures for the thermal curing and crosslinking of the layer (L) to below 150° C., so that even heat-sensitive substrates of the type used for example in thin-layer technology and in the production of conducting paths can be used as base materials. In general, the temperatures for the thermal curing and crosslinking of the layer (L) are within the range from 30° to 150° C., preferably within the range from 50° to 130° C. The duration of the thermal curing and crosslinking of the layer (L) is customarily within the range from 10 minutes to a few hours, for example 5 hours and the conditions of the thermal curing of the layer (L) are chosen in such a way that the cured and crosslinked relief images or resist patterns have the desired mechanical, physical and chemical properties.

The invention is illustrated in more detail by the experiments and examples below. The parts and percentages are by weight, unless otherwise stated. Parts by volume relate to parts by weight as the liter relates to the kilogram.

PREPARATION EXAMPLES 1 TO 3

1. Preparation of
N-p-toluenesulfonyl-N-methylaminodiphenylsulfonium trifluoromethanesulfonate (I)

10.65 g (0.03 mol) of N-p-toluenesulfonyldiphenylsulfilimine were suspended in 50 ml of dry toluene and, after addition of 6.55 g (0.04 mol) of methyl trifluoromethanesulfonate, were stirred under reflux for 2 hours. On cooling, the reaction solution divided into two phases, the lower of which was removed. The solid residue remaining on concentrating the lower phase was recrystallized from ethyl acetate and dried to give 11.0 g of the salt (I). Analysis and properties are indicated in Table 1.

2. & 3.: The same method was used to prepare compounds II and III listed in Table 1 complete with analyses and properties.

PREPARATION EXAMPLES 4 TO 6

4. Preparation of
N-p-toluenesulfonyl-N-methylaminodiphenylsulfonium tetrafluoroborate (IV)

10.65 g (0.03 mol) of N-p-toluenesulfonyldiphenylsulfilimine were dissolved in 40 ml of dry methylene chloride, and 4.44 g (0.03 mol) of trimethyloxonium tetrafluoroborate were added. After stirring overnight and concentrating, the reaction product formed a crystalline precipitate. Drying under reduced pressure left 11.45 g of the salt (IV). Analysis and properties are indicated in Table 1.

5. & 6.: The same method was used to prepare compounds V and VI listed in Table 1 complete with analyses and properties.

EXAMPLES 7 TO 9

7. Preparation of N-p-toluenesulfonyl-N-methylaminodiphenylsulfonium hexafluorophosphate (VII)

65.8 g (0.185 mol) of p-toluenesulfonyldiphenylsulfilimine and 46.6 g (0.37 mol) of dimethyl sulfate were heated under reflux for 14 hours in 750 ml of toluene. The bottom phase of the two-phase reaction mixture obtained was separated off and stirred into a solution of 216.5 g (1.1 mol) of 75% strength hexafluorophosphoric acid, 185 ml of water and 37 ml of ethanol. The resulting crystals of crude product were filtered off with suction. Recrystallization from acetone/water and drying under reduced pressure left 61.6 g of the salt VII.

8. & 9.: The same method was used to prepare compounds VIII and IX listed in Table 1 complete with analyses and properties.

making it possible to monitor the course of the exothermic curing reaction. If no effect was observed 10 minutes after equilibrating the sample temperature to the bath temperature, the bath temperature was raised by 20° C. and so on. The course of the curing reaction was ploted as a temperature-time curve and characterized by the following data:

a. Response temperature: bath temperature
b. Curing time: time from equilibration of the sample temperature to the bath temperature to attainment of maximum temperature
c. Maximum temperature

TABLE 2

Curing of Epikote ® 828 with N—sulfonylaminosulfonium salts as catalyst

| Catalyst compound | Concentration in Epikote ® 828 (phr) | Response temperature (°C.) | Curing time (min. sec.) | Maximum temperature (°C.) |
|---|---|---|---|---| phr = parts per one hundred parts of resin

EXAMPLES 8 to 10

Effect of cocatalysts on the curing behavior of epoxy resins with N-sulfonylaminosulfonium salts

TABLE 1

N—Sulfonylaminosulfonium salts of the formula

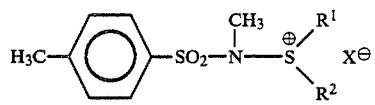

| Preparation Example/compound | R¹ | R² | X⊖ | Melting point (°C.) | | Analyses | | | | |
|---|---|---|---|---|---|---|---|---|---|---|
| 1/I | Ph | Ph | CF₃SO₃⊖ | 126–7 | calculated | C 48.55 | H 3.85 | S 18.5 | N 2.70 | | F 10.98 |
| | | | | | found | C 48.3 | H 3.8 | S 18.9 | N 2.7 | | F 10.8 |
| 2/II | Ph | CH₃ | CF₃SO₃⊖ | 89–94 | calculated | C 42.01 | H 3.94 | S 21.01 | N 3.06 | | F 12.47 |
| | | | | | found | C 41.7 | H 4.0 | S 20.7 | N 3.2 | | F 12.3 |
| 3/III | CH₃ | CH₃ | CF₃SO₃⊖ | 139–41 | calculated | C 33.42 | H 4.05 | S 24.30 | N 3.54 | | F 14.43 |
| | | | | | found | C 33.1 | H 4.0 | S 24.3 | N 3.6 | | F 14.1 |
| 4/IV | Ph | Ph | BF₄⊖ | 176–8 | calculated | C 52.52 | H 4.38 | S 14.0 | N 3.06 | B 2.41 | F 16.63 |
| | | | | | found | C 52.1 | H 4.5 | S 14.3 | N 3.1 | B 2.4 | F 16.5 |
| 5/V | Ph | CH₃ | BF₄⊖ | 101–104 | calculated | C 45.57 | H 4.56 | S 16.2 | N 3.54 | B 2.78 | F 19.24 |
| | | | | | found | C 45.6 | H 4.5 | S 16.5 | N 3.6 | B 4.1 | F 18.7 |
| 6/VI | CH₃ | CH₃ | BF₄⊖ | 178–181 | calculated | C 36.04 | H 4.81 | S 19.22 | N 4.2 | B 3.3 | F 22.82 |
| | | | | | found | C 36.1 | H 4.8 | S 19.4 | N 4.2 | B 3.3 | F 22.7 |
| 7/VII | Ph | Ph | PF₆⊖ | 182–88 | calculated | C 46.6 | H 3.88 | S 12.46 | N 2.72 | P 6.02 | F 23.3 |
| | | | | | found | C 47.8 | H 4.0 | S 13.0 | N 2.8 | P 5.8 | F 22.8 |
| 8/VIII | Ph | Ph | AsF₆⊖ | 190–91 | calculated | C 42.93 | H 3.58 | S 11.45 | N 2.50 | As 13.42 | F 20.39 |
| | | | | | found | C 43.3 | H 3.5 | S 11.7 | N 2.6 | As 13.5 | F 20.3 |
| 9/IX | Ph | Ph | SbF₆⊖ | 169–73 | calculated | C 39.64 | H 3.30 | S 10.57 | N 2.31 | Sb 20.07 | F 18.83 |
| | | | | | found | C 40.3 | H 3.3 | S 10.5 | N 2.4 | Sb 19.7 | F 18.1 |

Ph = phenyl

EXAMPLE 1 TO 7

Curing of eposy resins with N-sulfonylaminosulfonium salts

Resin mixtures of bisphenol A diglycidyl ether (Epikote ® 828 from Shell) and the catalysts indicated in Table 2 (cf. Table 1) were prepared by milling in an Achat mill at room temperature. The various mixtures of the same amount in each case were introduced into test tubes which were each dipped into a preheated oil bath. A thermocouple was immersed in all samples, The method described in Examples 1 to 7 was followed to prepare resin mixtures from 100 parts of bisphenol A diglycidyl ether (Epikote ® 828 from Shell), 2.4 parts of compound VII and the cocatalysts indicated in Table 3, and the course of the crosslinking reaction was characterized in terms of the temperature-time curve in the manner described in Examples 1 to 7. The results indicated in Table 3 show that peroxides and quinones significantly increase the curing activity of N-sulfonylaminosulfonium salts.

TABLE 3

Effect of cocatalysts on the curing behavior of Epikote ® 828 with N—sulfonylaminosulfonium salt VII (cf. Table 1) (use concentration 2.4%)

| | Cocatalyst | | Curing activity | |
| --- | --- | --- | --- | --- |
| Example | Type | Concentration (%) | Response temperature (°C.) | Curing time (min/sec) | Maximum temperature (°C.) |
| 8 | without | — | 140 | 6'05" | 229 |
| 9 | t-butylperbenzoate | 2 | 140 | 3'50" | 225 |
| 10 | 2,3-dichloro-5,6-cicyano-p-benzoquinone | 0.5 | 140 | 2'53" | 254 |

EXAMPLES 11 and 12

Shelf life of eposy resins with N-sulfonylaminosulfonium salts

The method of Example 1 to 7 was followed to prepare mixtures of 100 parts of bisphenol A diglycidyl ether and 2.4 or 3.0 parts of N-p-toluenesulfonyl-N-methylaminodiphenylsulfonium hexafluorophosphate, and the viscosity was monitored as a function of the storage time at room temperature (25° C.). The results are listed in Table 4. 5-Month storage at 20° C. increases the viscosity of the mixtures by less than 7-fold. A mixture thus stored is still readily processable.

TABLE 4

Shelf life of epoxy resins with N—p-toluenesulfonyl-N—methylaminodiphenylsulfonium hexafluorophosphate as catalyst

| Storage time at 25° C. (days) | Catalyst concentration 2.4% Viscosity (m Pas) at 20° C. | Catalyst concentration 3.0% Viscosity (m Pas) at 20° C. |
| --- | --- | --- |
| 0 | 26,000 | 27,400 |
| 33 | — | 38,800 |
| 36 | 33,400 | — |
| 62 | — | 53,700 |
| 65 | 55,500 | — |
| 136 | — | 172,000 |
| 150 | 169,000 | — |

EXAMPLES 13 AND 14

Properties of fully cured molding materials

EXAMPLE 13

The method described in Examples 1 to 7 was followed to prepare a mixture M 1 from 100 parts of bisphenol A diglycidyl ether, 3 parts of N-p-toluenesulfonyl-N-methylaminodiphenylsulfonium hexafluorophosphate and 0.5 part of chloranil, which was cured at 140° C. for 15 minutes and postcured at 200° C. for 75 minutes. The glass transition temperature determined in accordance with DIN 53,445 was 145° C.

EXAMPLE 14

Example 13 was repeated to prepare a mixture M 2 from 100 parts of bisphenol A diglycidyl ether and 2.4 parts of N-p-toluenesulfonyl-N-methylaminodiphenylsulfonium hexafluorophosphate and this mixture was subjected to curing at 150° C. for 30 minutes and postcuring at 200° C. for one hour. A glass transition temperature of 130° C. was found.

EXAMPLES 15 AND 16

Light-sensitive recording materials

In each case, 72 parts of a methyl methacrylate copolymer which contained 35% of o-nitrobenzyl acrylate as copolymerized units, 27 parts of a bisphenol A diglycidyl ether (Epikot ® 828 from Shell), 0.7 part of benzidimethyl ketal, 0.1 part of black dye, 0.2 part of the polymethine dye of the formula

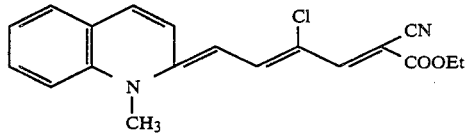

and 4 parts of salts VII (Example 15) or VIII (Example 16) in accordance with Table 1 as catalysts were dissolved in each case in 160 parts by volume of ethyl acetate. These solutions were cast onto polyester films in such a way that, after removal of solvent and drying, the resulting light-sensitive curable layers (L) had thicknesses of about 10 μm in each case.

To prepare resist patterns, the free surfaces of the layers (L) were then each uniformly pre-exposed for 90 sec with a 500 watt very high pressure mercury lamp and laminated onto a piece of glass vapor-coated with palladium glass. The light-sensitive layers (L) were then subjected to imagewise exposure by means of a photographic positive original through the polyester film for 2 minutes with a 500 W high pressure mercury lamp. The polyester films were then peeled off, and the exposed areas of the layers (L) were washed out with an aqueous developer solution (81 parts of water, 16 parts of 2-butoxyethanol, 3 parts of triethanolamine) in 1.5 minutes. The true resist patterns thus obtained were first exposed once more uniformly, i.e. without imagewise original, using the same lamp as above for a period of 15 minutes in each case and were then each thermally cured and crosslinked in the course of 120 minutes in total in increasing temperature steps of 20° C. within the temperature range from 60° C. to 140° C. The resists obtained were highly suitable for use as etch resists and resistant to the concentrated nitric acid (65% strength) of the palladium etching bath. Etching and stripping the resists with hot dimethylformamide gave palladium paths which constituted a faithful reproduction of the image original.

EXAMPLES 17 AND 18 AND COMPARATIVE EXPERIMENTS 1 AND 2

Surface coatings

In each case, 15% strength acetone solutions of bisphenol A diglycidyl ethers had added to them the following salts as catalysts in such amounts that the catalyst content was in each case 3%, based on the bisphenol A diglycidyl ether.

Example 17: N-p-Toluenesulfonyl-N-methylaminodiphenylsulfonium hexafluoroarsenate (compound VIII from Table 1)

Example 18: N-p-Toluenesulfonyl-N-methylaminodiphenylsulfonium hexafluoroantimonate (compound IX from Table 1)

Comparative Experiment 1: N-Phenylcarbamoylmethylsulfoxonium hexafluorophosphate (cf. No. EP-A-44,274).

Comparative Experiment 2: Bis(p-tolyl)iodonium hexafluoroarsenate (cf. No. DE-A-2,518,639).

The photosensitive mixtures prepared without heating were applied with an 80 μm doctor blade (effective layer thickness about 50 μm) to glass plates, were flashed off for 5 minutes to remove the acetone before exposure and were guided in air at a distance of about 10 cm past 2 lamps of 80 W/cm output at the belt speeds stated in each case. The exposed layers were assessed immediately after exposure, after 2 hours and after 1 day in accordance with the following quality criteria:
gelled: no longer fluent, tacky
firm: surface nontacky, but not fingernail hard
fully cured: nontacky, fingernail hard.

As the results indicated in Table 5 show, the mixtures of Examples 17 and 18 are distinctly better than the mixture of Comparative Experiment 1 and approximately as good as the mixture of Comparative Experiment 2, which, however, contains a toxic catalyst salt.

TABLE 5

| Curing | Curing of surface coating Cure result | | |
|---|---|---|---|
| | at once | after 2 hours | after 1 day |
| Belt speed 3 m/min | | | |
| Comparative Experiment 1 | gelled | gelled | gelled |
| Comparative Experiment 2 | fully cured | fully cured | fully cured |
| Example 17 | firm | fully cured | fully cured |
| Example 18 | firm | fully cured | fully cured |
| Belt speed 15 m/min | | | |
| Comparative Experiment 1 | gelled | gelled | gelled |
| Comparative Experiment 2 | firm | firm | fully cured |
| Example 17 | gelled | firm | firm |
| Example 18 | firm | firm | fully cured |

EXAMPLES 19-21

In the manner of Examples 17 and 13, 1% of salt VIII from Table 1 was dissolved as catalyst in Epikote ® 828, and the stated amount of the compounds described in Table 6, based on Epikote ® 828, was added. This was followed by flashing off in the manner described in Examples 17 and 18 and curing at a belt speed of 15 m. After storage for one day, the pendulum hardness of the paints films obtained was determined by the method of K,uml/o/ nig.

The results in Table 6 show that the rate of curing obtainable with N-sulfonylaminosulfonium salts is distinctly speeded up by addition of other initiators which alone cannot initiate curing of epoxies.

TABLE 6

| Acceleration of curing with N—sulfonylaminosulfonium salts by means of other initiators | | | |
|---|---|---|---|
| Addition | Example 19 no additive | Example 20 Benzil dimethyl ketal 2% | Example 21 2-Methylthioxanthone 1% |
| Konig hardness after 1 day (sec) (curing speed 15 m/min) | 109 | 211 | 160 |

We claim:
1. A curable mixture containing
   (a) one or more compounds which, under the influence of a cationic catalyst, are convertible into a higher molecular weight compound, and
   (b) an active amount as a curing catalyst of an N-sulfonylaminosulfonium salt of the formula (I)

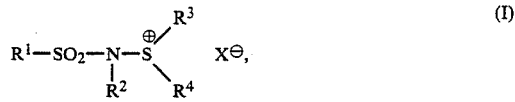

where
$R^1$ is $C_1$-$C_{18}$-alkyl, 5- or 6-ring-cycloalkyl or phenyl which may be substituted by chlorine or bromine atoms, $C_1$-$C_6$-alkyl, $C_1$-$C_6$-alkoxy or $C_1$-$C_6$-alkylthio groups or carboxyl or alkoxy-carbonyl groups,
$R^2$ is $C_1$-$C_6$-alkyl, 5- or 6-ring-cycloalkyl, aliphatic $C_1$-$C_6$-acyl or substituted or unsubstituted benzoyl,
$R^3$ and $R^4$ each have the same meanings as $R^1$ and can be identical to or different from $R^1$ and each other, and $X^\ominus$ is a nonnucleophilic anion.

2. A curable mixture as claimed in claim 1, wherein $X^\ominus$ is an anion of the formula (II)

$$[MY_nZ_m]^\ominus \quad \text{II}$$

or $CF_3So_3^\ominus$ or $ClO_4^\ominus$, where M is boron, bismuth, antimony, arsenic or phosphorus, Y is fluorine or chlorine, Z is hydroxyl, m is 0 or 1 and n is 4-6, with the proviso that the total of m and n is in each case greater by one than the valence of M.

3. A curable mixture as claimed in claim 1, which contains as curing catalyst an N-sulfonylaminosulfonium salt of the formula (I) where $R^1$ is phenyl or $C_1$-$C_4$-alkylphenyl, $R^2$ is $C_1$-$C_4$-alkyl, $R^3$ and $R^4$, identical or different, are each $C_1$-$C_4$-alkyl, phenyl or $C_1$-$C_4$-alkylphenyl and $X^\ominus$ is an anion of the formula (II) as claimed in claim 2.

4. A curable mixture as claimed in claim 1, which additionally contains an active amount of an oxidizing agent from the class of the substituted or unsubstituted quinones or from the class of the organic peroxides.

5. A curable mixture as claimed in claim 1, which contains as curable compound (a) a 1,2-epoxide, an olefinically unsaturated compound, an amino resin or a phenolic resin.

6. A curable mixture as claimed in claim 1, which contains the curing catalyst (b) in an amount of from 0.1 to 15% by weight of compound(s) (a).

7. A curable mixture as claimed in claim 4, which contains an oxidizing agent in an amount of from 0.01 to 10% by weight of the amount of compound(s) (a).

8. A process for preparing a cured molding or surface coating from a curable mixture as claimed in claim 1, which comprises heating the mixture to 80°-160° C.

9. A process for preparing a cured molding or surface coating from a curable mixture as claimed in claim 1, which comprises curing the mixture by irradiation with light of wavelength 200-600 nm.

10. A light-sensitive recording material suitable for the production of relief images or resist patterns comprising, applied to a dimensionally stable substrate, a light-sensitive curable layer (L) containing
   (i) one or more compounds having two or more aromatic and/or hetaromatic o-nitrocarbinol ester groups of the formula.

* * * * *

UNITED STATES PATENT AND TRADEMARK OFFICE
CERTIFICATE OF CORRECTION

PATENT NO. : 4,734,444
DATED : March 29, 1988
INVENTOR(S) : HENNE et al.

It is certified that error appears in the above-identified patent and that said Letters Patent is hereby corrected as shown below:

In the claims:

Cancel claim 10.

ON THE TITLE PAGE, "10 Claims" should read -- 9 Claims --.

Signed and Sealed this

Second Day of August, 1988

Attest:

DONALD J. QUIGG

*Attesting Officer*     *Commissioner of Patents and Trademarks*